United States Patent
Watanabe et al.

(10) Patent No.: US 11,444,055 B2
(45) Date of Patent: Sep. 13, 2022

(54) MANUFACTURING METHOD OF SEMICONDUCTOR APPARATUS AND SEMICONDUCTOR APPARATUS

(71) Applicant: CANON KABUSHIKI KAISHA, Tokyo (JP)

(72) Inventors: Shinichiro Watanabe, Kawasaki (JP); Youichi Fukaya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/002,189

(22) Filed: Aug. 25, 2020

(65) Prior Publication Data

US 2021/0066241 A1  Mar. 4, 2021

(30) Foreign Application Priority Data

Aug. 29, 2019 (JP) .............................. JP2019-157290

(51) Int. Cl.
*H01L 23/00* (2006.01)

(52) U.S. Cl.
CPC .............. *H01L 24/83* (2013.01); *H01L 24/29* (2013.01); *H01L 24/32* (2013.01);
(Continued)

(58) Field of Classification Search
CPC ..... H01L 24/83; H01L 25/0657; H01L 25/50; H01L 2224/83896; H01L 2224/45147;
(Continued)

(56) References Cited

U.S. PATENT DOCUMENTS

2009/0149023 A1  6/2009  Koyanagi
2019/0123088 A1*  4/2019  Kwon ............... H01L 27/14609

FOREIGN PATENT DOCUMENTS

JP    5-36966 A    2/1993
JP    2018-181957 A   11/2018

OTHER PUBLICATIONS

C. L. Chen et al,; "Wafer-Scale 3D Integration of InGaAs Image Sensors with Si Readout Circuits;" IEEE International Conference on 3D System Integration, 2009. 3DIC 2009, pp. 1-4; ©2009 Institute of Electrical and Electronics Engineers.

* cited by examiner

*Primary Examiner* — Jasmine J Clark
(74) *Attorney, Agent, or Firm* — Canon U.S.A., Inc., IP Division

(57) ABSTRACT

A manufacturing method of a semiconductor apparatus includes preparing an intermediate member that includes a first member having a first substrate comprising a semiconductor element formed thereon, a second member having a second substrate, the second substrate including a part of a circuit electrically connected to the semiconductor element and having a linear expansion coefficient different from that of the first substrate, and a third member having a third substrate showing such a linear expansion coefficient that a difference between itself and the linear expansion coefficient of the first substrate is smaller than a difference between the linear expansion coefficients of the first substrate and the second substrate, and includes bonding the first member and the second member together. A first bonding electrode containing copper electrically connected to the semiconductor element and a second bonding electrode containing copper electrically connected to the circuit are bonded together.

21 Claims, 13 Drawing Sheets

(52) U.S. Cl.
CPC ............... *H01L 2224/29076* (2013.01); *H01L 2224/29147* (2013.01); *H01L 2224/32145* (2013.01); *H01L 2224/83895* (2013.01); *H01L 2224/83896* (2013.01)

(58) Field of Classification Search
CPC ..................... H01L 24/29; H01L 24/82; H01L 2224/83862; H01L 2224/80895
See application file for complete search history.

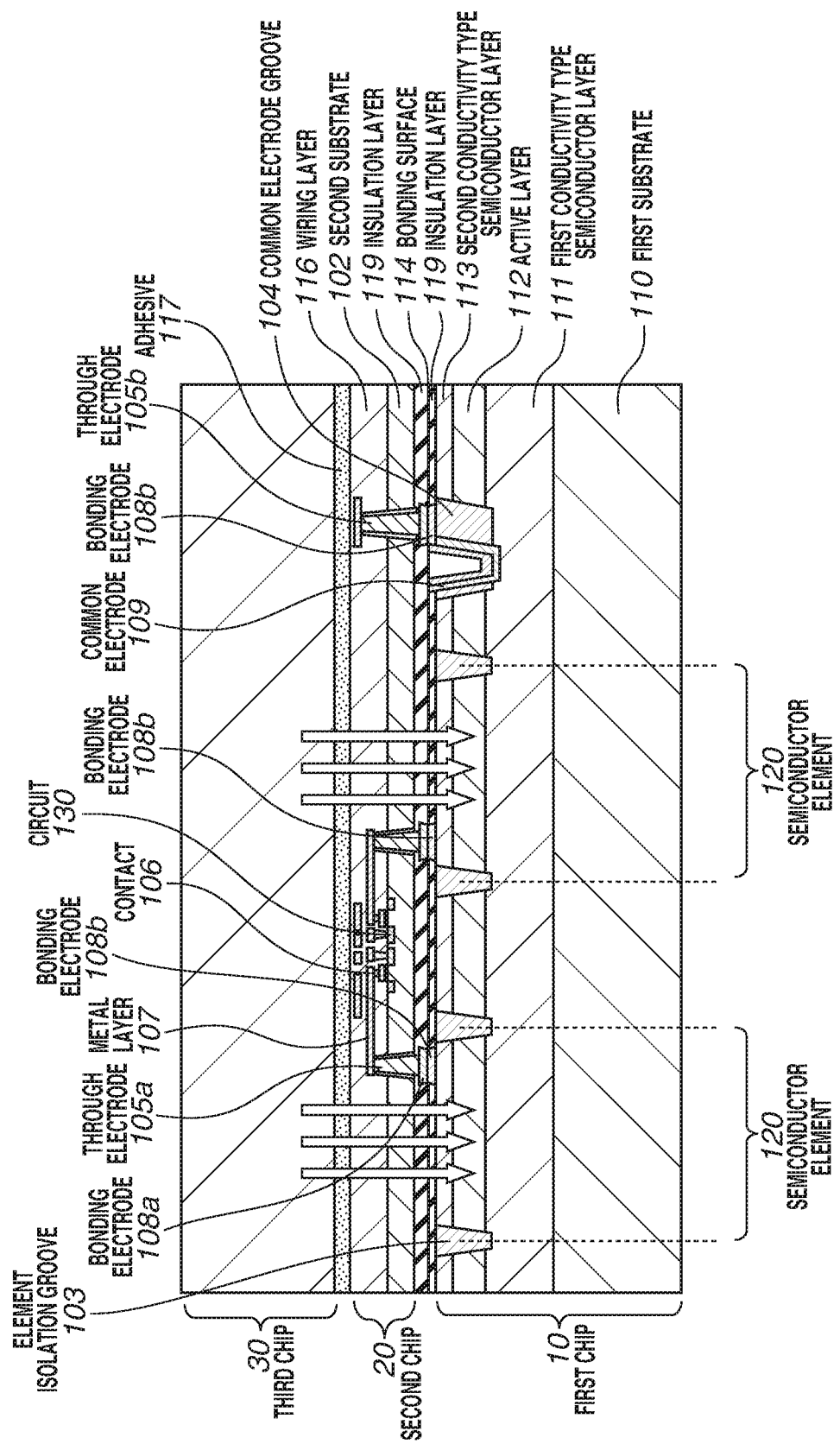

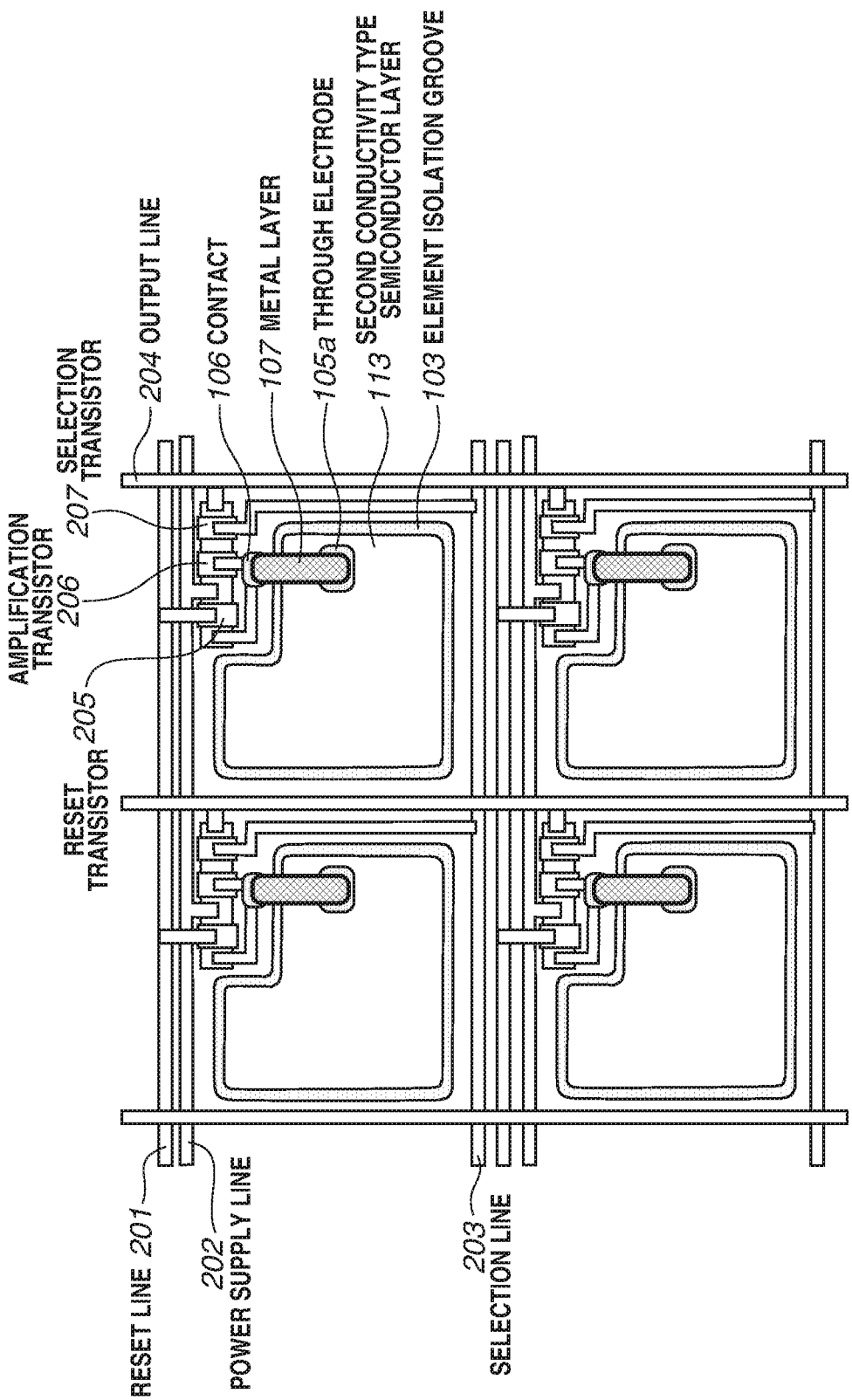

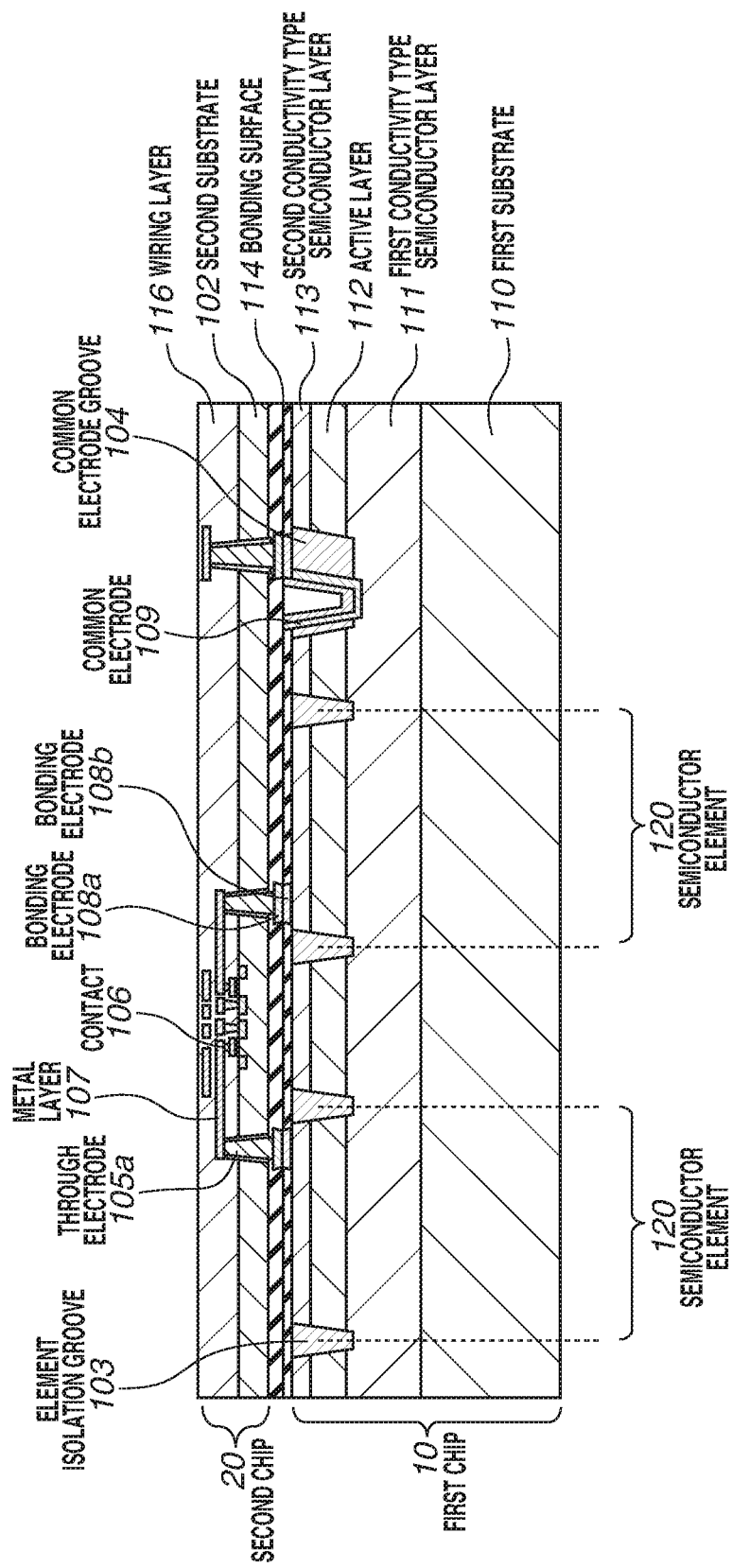

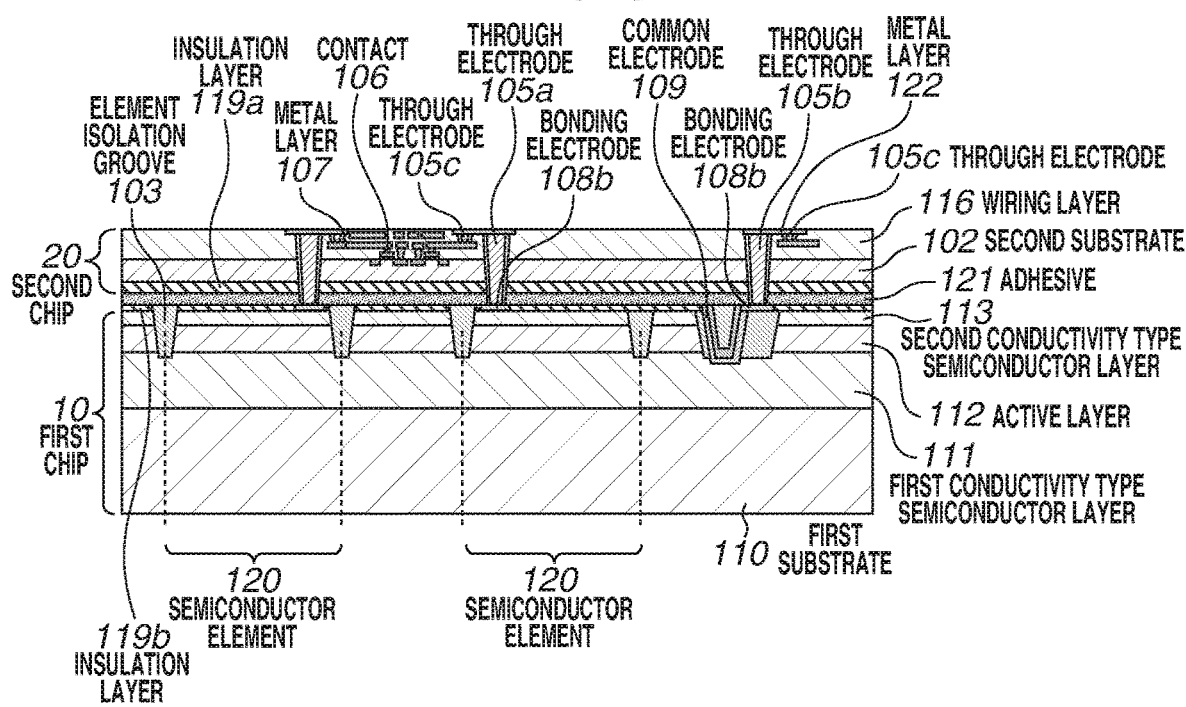
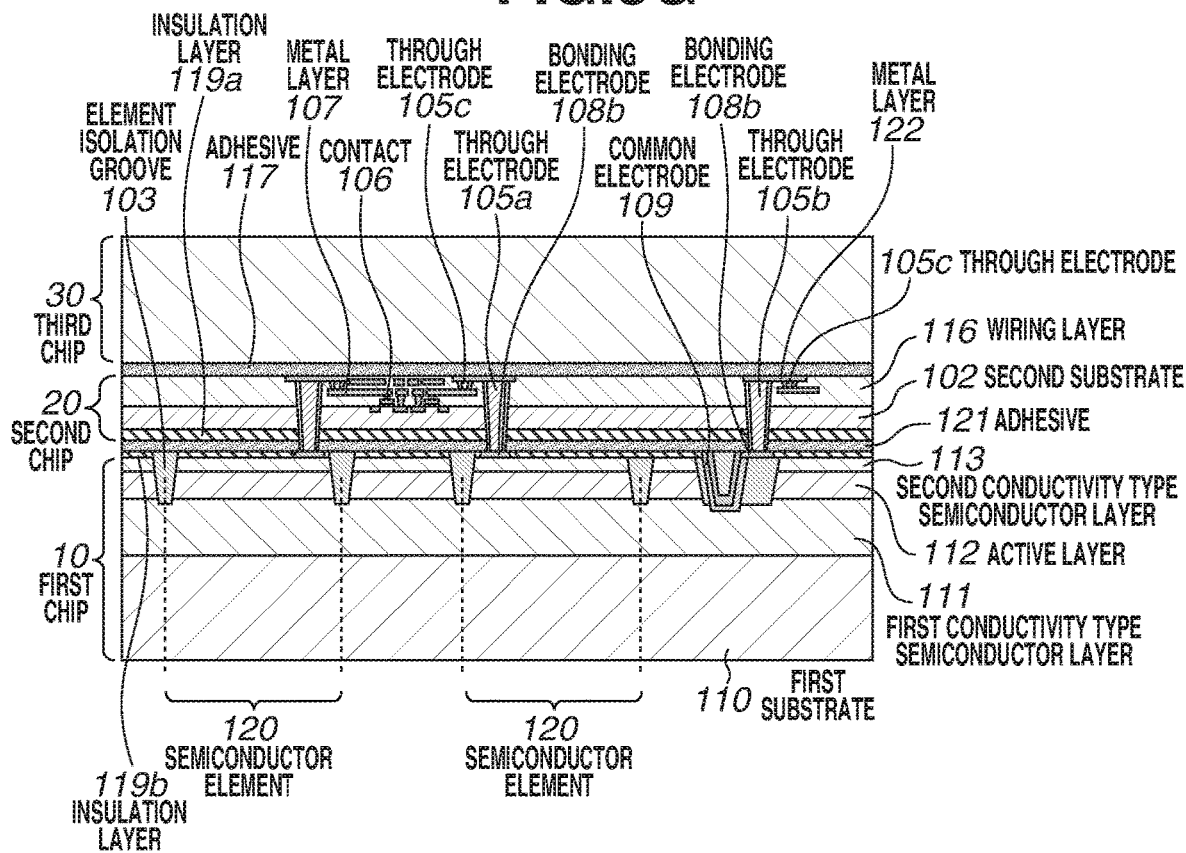

FIG.7B
FRONT VIEW
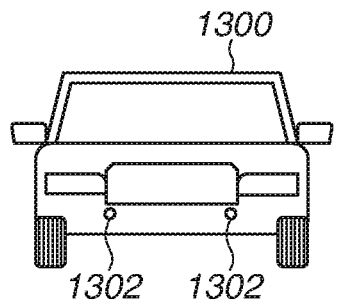
TOP VIEW
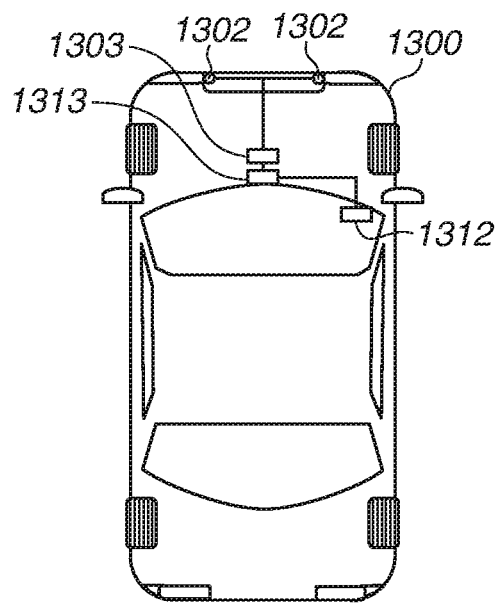
REAR VIEW
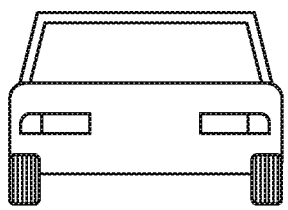

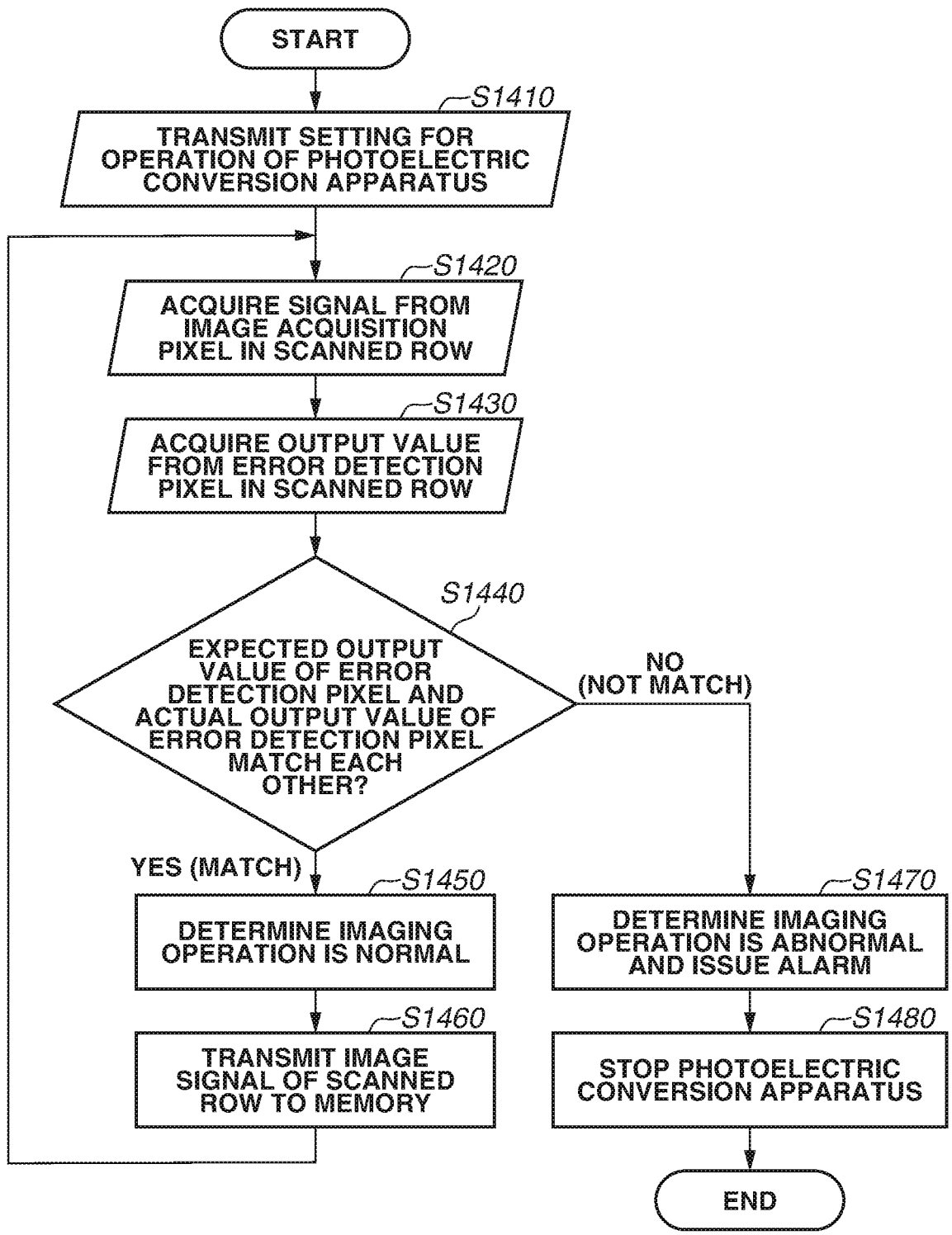

MANUFACTURING METHOD OF SEMICONDUCTOR APPARATUS AND SEMICONDUCTOR APPARATUS

BACKGROUND

Field

The present disclosure relates to a manufacturing method of a semiconductor apparatus and a semiconductor apparatus.

Description of the Related Art

An interest in a semiconductor apparatus including at least one of a light receiving element and a light emitting element that are composed of a compound semiconductor material. Examples of the desirable compound semiconductor material include indium phosphide (InP) and indium gallium arsenide (InGaAs). These compound semiconductor materials have wider band-gap energy than that of silicon (Si), and thus can receive or emit light of a longer wavelength than a wavelength of light that can be received or emitted by Si.

Meanwhile, a circuit having a readout function or a switching function is preferably composed of Si. Thus, a semiconductor apparatus including a light receiving element or a light emitting element in an infrared region, in which the wavelength of light is long, is manufactured by electrically and mechanically bonding together a compound semiconductor substrate including the light receiving element or the light emitting element, and a silicon substrate provided with a circuit.

C. L. Chen et al., "Wafer-Scale 3D Integration of InGaAs Image Sensors with Si Readout Circuits", IEEE International Conference on 3D System Integration, 2009. 3DIC 2009, pp. 1 to 4, discusses a semiconductor apparatus in which a silicon substrate on which a complementary metal oxide semiconductor (CMOS) circuit is formed and a compound semiconductor substrate on which a semiconductor element is formed are bonded together.

Although the silicon substrate and the compound semiconductor substrate are typically bonded together at normal temperatures, a method of heating solder balls or plated solder bumps to bond the substrates together can raise reliability of the bonding. Meanwhile, the compound semiconductor and silicon are different in linear expansion coefficient, so that distortion due to warpage and deformation of the substrates occurs in a process of the heat-bonding.

SUMMARY

The present disclosure is directed to providing a semiconductor apparatus and a method of manufacturing the semiconductor apparatus. Even if substrates different in linear expansion coefficient are bonded together by subjecting to heat, the semiconductor apparatus can reduce misalignment which arises in superimposing the substrates at the time of bonding, and reduce warpage and deformation of the substrates and chips, and high reliability can be obtained in bonding and mounting.

According to an aspect of the present disclosure, a manufacturing method of a semiconductor apparatus includes preparing an intermediate member that includes a first member including a first substrate on which a semiconductor element is formed, a second member including a second substrate that includes part of a circuit electrically connected to the semiconductor element and that has a linear expansion coefficient different from a linear expansion coefficient of the first substrate, and a third member including a third substrate having such a linear expansion coefficient that a difference between the linear expansion coefficient of the third substrate and the linear expansion coefficient of the first substrate is smaller than a difference between the linear expansion coefficients of the first substrate and the second substrate, the second member being interposed between the first member and the third member, and heating the intermediate member to bond the first member and the second member together. In the bonding of the first member and the second member, a first bonding electrode containing copper that is electrically connected to the semiconductor element and a second bonding electrode containing copper that is electrically connected to the circuit are bonded together.

Further features of the present disclosure will become apparent from the following description of exemplary embodiments with reference to the attached drawings.

BRIEF DESCRIPTION OF THE DRAWINGS

FIG. 1 is a sectional view illustrating a semiconductor apparatus according to a first exemplary embodiment.

FIG. 2 is a plan view illustrating the semiconductor apparatus according to the first exemplary embodiment.

FIG. 4 is a sectional view illustrating a semiconductor apparatus according to a second exemplary embodiment.

FIG. 5A to 5G are sectional views illustrating a manufacturing method of a semiconductor apparatus according to a third exemplary embodiment.

FIGS. 7A and 7B are schematic views illustrating a photoelectric conversion system and a mobile object according to a fifth exemplary embodiment.

FIG. 8 is a flowchart of operations of the photoelectric conversion system according to the fifth exemplary embodiment.

DESCRIPTION OF THE EMBODIMENTS

Figure 3A:
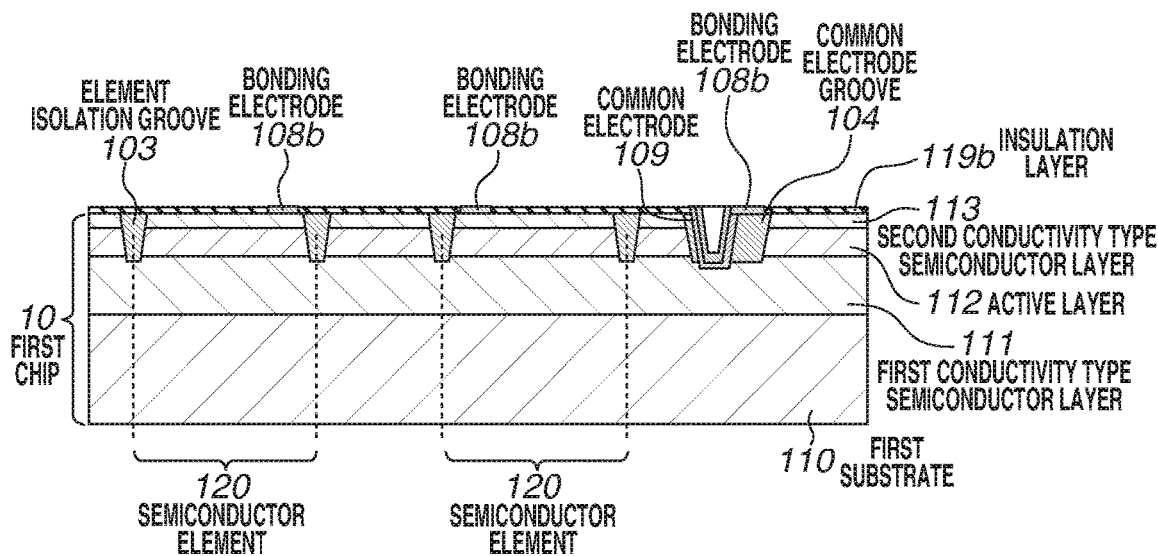
FIGS. 3A to 3F are sectional views each illustrating a manufacturing method of the semiconductor apparatus according to the first exemplary embodiment.

Exemplary embodiments described below are merely examples to embody technical ideas of the present invention, and do not limit the present invention. The sizes of members and positional relationships among the members illustrated in the drawings may be emphatically illustrated to provide a clear explanation. In the following description, the same constituent element is denoted by the same reference sign and the description thereof may be omitted.

A description will be given of a semiconductor apparatus according to a first exemplary embodiment of the present disclosure with reference to FIG. 1. FIG. 1 is a sectional view illustrating the semiconductor apparatus according to the first exemplary embodiment. The semiconductor apparatus is configured such that a first chip (first member) 10, a second chip (second member) 20, a third chip (third member) 30 are stacked in sequence. The first chip 10 includes a first substrate 110 composed of a compound semiconductor and a semiconductor element 120 formed on the first substrate 110. The semiconductor element 120 is composed of the compound semiconductor. The second chip 20 contains silicon, and includes a circuit electrically connected to the semiconductor element 120. The third chip 30 includes a third substrate. A difference in linear expansion coefficient between the third substrate and the first chip 10 is smaller than a difference in linear expansion coefficient between the first chip 10 and the second chip 20. In FIG. 1, the third chip 30 is composed of the third substrate.

A case in which the semiconductor element 120 is a light receiving element will be described below. In this case, a circuit 130 is, for example, a readout circuit that reads a signal from the light receiving element. The semiconductor element 120 is not limited to the light receiving element, but may be a light emitting element. The circuit 130 in the case where the semiconductor element 120 is the light emitting element is, for example, a control circuit that controls turning ON/OFF of light emission of the light emitting element. That is, the circuit 130 is the control circuit that controls supply of a potential to the light emitting element. The same applies to other exemplary embodiments.

A silicon substrate, on which a wafer process technology and an integration technology have been accumulated, is preferably used as a second substrate 102 included in the second chip 20 from the viewpoint of mounting a readout circuit. The semiconductor element 120 is mounted on the first substrate 110 which is different from the second substrate 102 mainly because a substrate made of a material different in light absorption characteristics from those of silicon contained in part of the circuit 130 is used as the first substrate 110. From this viewpoint, the material different from silicon, e.g., the compound semiconductor, is preferably used as the material of the first substrate 110 included in the first chip 10.

The compound semiconductor contained in the first substrate 110 includes, for example, a group III-V semiconductor. For example, the compound semiconductor contains at least one semiconductor selected from the group consisting of gallium arsenide (GaAs), indium arsenide (InAs), indium phosphide (InP), aluminum phosphide (AlP), aluminum gallium nitride (AlGaN), and gallium nitride (GaN). The compound semiconductor may be a semiconductor having a ternary or more mixed-crystal composition. These materials have a wider band gap than Si. Thus, these materials can handle light of a wavelength that cannot be absorbed by Si, and it becomes necessary to use substrates made of both the compound semiconductor and Si. At least one semiconductor selected from the group consisting of InP and indium gallium arsenide (InGaAs) is preferably used.

Specifically, the first chip 10 includes a compound semiconductor substrate (growth substrate) constituting the first substrate 110, a semiconductor layer 111 of first conductivity type, an active layer 112, and a semiconductor layer 113 of second conductivity type. As described above, the compound semiconductor serving as the first substrate 110 is preferably an InP substrate, a GaAs substrate, and the like. Crystals of the material such as an InGaAs-based material, a gallium arsenide antimony (GaAsSb)-based material, and an aluminum gallium indium arsenide phosphide (AlGaInAsP)-based material, can be grown on the InP substrate or the GaAs substrate. An absorption wavelength band range of such materials is on the longer wavelength side than an absorption wavelength band range of single-crystal silicon. The first chip 10 may be configured such that a compound semiconductor layer such as an InP layer is arranged on another substrate such as a sapphire substrate. While the present exemplary embodiment is described by using the silicon substrate as the material of the second chip 20 and the InP substrate as the material of the first chip 10, as an example, the materials of the substrates can be appropriately selected as the need arises.

The semiconductor element 120 is formed on the first substrate 110. The semiconductor element 120 includes at least the semiconductor layer 111 of the first conductivity type (e.g., n-type), the semiconductor layer 113 of second conductivity type (e.g., p-type), and the active layer 112 formed between the semiconductor layer 111 and the semiconductor layer 113.

In FIG. 1, a plurality of semiconductor elements 120 is formed on the first substrate 110, and an element isolation groove 103 is formed between adjacent semiconductor elements 120. A common electrode groove 104 is formed to separate a region in which the plurality of semiconductor elements 120 is arranged, from the other regions. In a case where the semiconductor element 120 is the light receiving element, the region in which the plurality of semiconductor elements 120 is arranged is a pixel region.

A surface of the first chip 10 on which the semiconductor element 120 is formed and a surface of the second chip 20 on which the circuit 130 is formed are bonded together so that the semiconductor element 120 and the circuit 130 are electrically connected to each other. The semiconductor element 120 and the circuit 130 constitute a pixel.

In FIG. 1, an insulation layer 119 is arranged between the first chip 10 and the second chip 20. This prevents current leakage between the semiconductor elements 120. The insulation layer 119 can be configured, for example, by including at least one of a silicon oxide and or a silicon nitride film.

The second chip 20 includes the second substrate 102 formed by silicon and a wiring layer 116. The wiring layer 116 includes a metal layer 107. The circuit 130 of the second chip 20 is connected, via a through electrode 105a, to the metal layer 107 formed in the wiring layer 116. A transistor of the semiconductor element 120 and a contact 106 are electrically connected to each other via the through electrode 105a and the metal layer 107. The wiring layer 116 is arranged between the second substrate 102 and the third chip 30.

The third chip 30 and the second chip 20 are bonded together with, for example, an ultraviolet-curing adhesive. The bonding of the third chip 30 and the second chip 20 is not limited thereto, and may be bonded via an oxide film or a thin metal film. The third chip 30 and the second chip 20 are preferably bonded together at normal temperatures from the viewpoint of preventing warpage.

The closer a linear expansion coefficient of the third chip 30 to that of the first substrate 110, the better. This can reduce the warpage of the substrate. In a case where the first substrate 110 contains the group III-V semiconductor, it is preferable that the linear expansion coefficient of the third chip 30 be in a range from $3\times10^{-6}$/K to $6.5\times10^{-6}$/K inclusive. Specifically, glass having a linear expansion coefficient close to that of the first substrate 110 and the group III-V semiconductor having a linear expansion coefficient that is equal to that of the first substrate 110 can be used. The glass having the linear expansion coefficient close to that of the first substrate 110 is, for example, glass having a linear expansion coefficient in a range from $4\times10^{-6}$/K to $5.5\times10^{-6}$/K inclusive.

A thickness of the third chip 30 is preferably equal to that of the first substrate 110. In a case where the semiconductor element 120 is at least one of the light receiving element and the light emitting element, when light enters or is emitted from the third chip 30 side, it is preferable that a material having light transmissivity is selected with respect to light having a wavelength to be used. Having light transmissivity means that the material has transmittance of 70% or more with respect to light having the wavelength to be used light. The light may also enter or be emitted from the first substrate 110 side of the first chip 10. In this case, the material of the third chip 30 does not need to have light transmissivity.

A bonding electrode 108b is arranged on the semiconductor layer 113 of the semiconductor element 120, and is connected to a bonding electrode 108a that is electrically connected to the circuit of the second chip 20. Metals such as copper can be used for the bonding electrodes 108a and 108b.

A common electrode 109 connects the first conductivity type semiconductor layer 111 and the bonding electrode 108b to each other, and is electrically connected to the bonding electrode 108a that is connected to the through electrode 105b. In this manner, carriers generated in the light receiving element constituting the semiconductor element 120 can be transmitted to the circuit of the second chip 20.

FIG. 2 is a plan view illustrating a neighborhood of a bonding surface of the semiconductor apparatus according to the first exemplary embodiment. FIG. 2 illustrates four pixels arrayed in a matrix of two rows and two columns. A part having the same function as that illustrated in FIG. 1 is denoted by the same reference sign.

As described above, the second chip 20 includes part of the circuit 130. In FIG. 2, the circuit 130 is a pixel transistor composed of a plurality of complementary metal oxide semiconductor (CMOS) transistors. Various types of semiconductor regions, such as a source region and drain region of the CMOS transistor, are arranged in the second substrate 102. Specifically, the pixel transistor includes at least one of a reset transistor 205, an amplification transistor 206, and a selection transistor 207. A gate electrode of the pixel transistor is arranged on the second chip 20, and a plurality of wiring lines including conductive members is arranged on the wiring layer 116. The wiring that transmits a driving signal is arranged in each pixel, and is composed of a reset line 201, a power supply line 202, a selection line 203, and an output line 204. A signal from the reset line 201 drives the reset transistor 205. A signal, which comes from the selection line 203 and drives the selection transistor 207, is amplified by the amplification transistor 206, is output to the output line 204. The contact 106 is connected to a wiring line that leads to the reset transistor 205 and the amplification transistor 206.

The through electrode 105a is formed in a portion corresponding to the semiconductor layer 113 of the semiconductor element 120. An element isolation groove 103 is formed to surround the semiconductor element 120 in a plan view. The metal layer 107 is arranged to straddle the element isolation groove 103, and connects the contact 106 and the through electrode 105b to each other. With the configuration, a signal inside the semiconductor element 120 can be extracted to the amplification transistor 206. The amplification transistor 206 amplifies a signal based on the magnitude of the signal inside the semiconductor element 120, and can output the amplified signal to the output line 204.

Next, advantageous effects of the present exemplary embodiment will be described. In a comparative example, a semiconductor apparatus does not include the third chip.

In the present exemplary embodiment, the bonding electrode 108b that is connected to the common electrode 109 of the first chip 10 and the semiconductor element 120, and the bonding electrode 108a that is connected to the through electrodes 105a and 105b must be electrically connected to each other. For example, the InP substrate has a linear expansion coefficient of $4.5\times10^{-6}$/K, and the silicon substrate has a linear expansion coefficient of $2.4\times10^{-6}$/K. Thus, in the comparative example, in a case where the substrates are bonded at a heating temperature of 175° C., if a distance is 75 mm, a difference in dimension change is about 27 μm. This means that misalignment in superimposing the substrates at the time of bonding is significantly large relative to a pixel size of several μm. The size of the bonding electrode becomes large if a margin for misalignment in superimposing the substrates is taken into consideration, which makes it difficult to narrow a pixel pitch.

On the other hand, the present exemplary embodiment uses the substrate having the linear expansion coefficient close to that of the first substrate 110 of the first chip 10 as the third chip 30, and the second substrate 102 of the second chip is stacked at a position between the first substrate 110 of the first chip 10 and the third chip 30. That is, the first substrate 110 and the third chip 30 having the substantially equal linear expansion coefficient are bonded together by subjecting to heat with the second substrate 102 interposed therebetween. With the configuration, the second substrate 102 is stretched following the first substrate 110 above the second substrate 102 and the third chip 30 below it, thereby reducing misalignment. Accordingly, even if there is a difference between the linear expansion coefficient of the first substrate 110 and that of the second substrate 102, owing to the presence of the third chip 30, the warpage is unlikely to occur. Specifically, the occurrence of the warpage can be canceled out by arranging the first substrate 110 and the third chip 30 with the second substrate having the different linear expansion coefficient interposed therebetween. The configuration can reduce misalignment between the first substrate 110 included in the first chip 10 and the second substrate 102 included in the second chip 20. Further, if a thickness of the second substrate 102 is smaller than that of the first substrate 110, a larger effect can be produced in reducing misalignment, thereby a device having pixels arrayed at a narrow pitch can be provided. The configuration can also reduce the warpage and deformation of the substrates occurring at the time of heat-bonding or heat-mounting, and can provide a highly reliable semiconductor apparatus because peeling due to the warpage of the substrates and a mounting defect do not occur.

Next, a manufacturing method of the semiconductor apparatus according to the first exemplary embodiment will be described with reference to FIG. 1 and FIGS. 3A to 3F. The same constituent element as that described above is denoted by the same reference sign and a description thereof is omitted.

First, the first chip 10 is prepared as illustrated in FIG. 3A. Specifically, an n-type InP buffer layer constituting the semiconductor layer 111, an InGaAs layer constituting the active layer 112, an InP layer constituting the semiconductor layer 113 are epitaxially grown in sequence on the InP substrate constituting the first substrate 110. With the process, the semiconductor element 120 is formed on the first substrate 110. A thickness of the first substrate 110 is, for example, 625 μm. The composition of In and Ga in the InGaAs layer is lattice-matched with the composition of the first substrate 110. Subsequently, the element isolation groove 103 and the common electrode groove 104 to isolate each semiconductor element 120 are formed on the first chip 10. The element isolation groove 103 and the common electrode groove 104 are formed from a surface of the first chip 10 on the second conductivity type semiconductor layer 113 side at such a depth as to reach the first conductivity type semiconductor layer 111. The element isolation groove 103 and the common electrode groove 104 are formed by dry-etching or wet-etching.

The bonding electrode 108b is formed within the semiconductor element 120, and the common electrode 109 is formed within the common electrode groove 104. The common electrode 109 is insulated from the active layer 112 and the second conductivity type semiconductor layer 113, and is electrically connected to the first conductivity type semiconductor layer 111. An electrode material only needs to be a material having desirable conductivity with the second conductivity type semiconductor layer 113, and can be made of gold (Au)-titanium (Ti), for example. The common electrode 109 is formed by a film formation method such as sputtering and vapor deposition. Subsequently, an insulation layer 119b is formed on a surface of the first chip 10 other than the bonding electrode 108b. To increase bonding strength between the first chip 10 and the second chip 20, the insulation layer is embedded in the element isolation groove 103 and the common electrode groove 104, and the surface is made smooth by chemical mechanical polishing (CMP) or the like. Thus, a portion corresponding to the grooves serves as a bonding surface, thereby increasing a contact area.

Figure 3B:
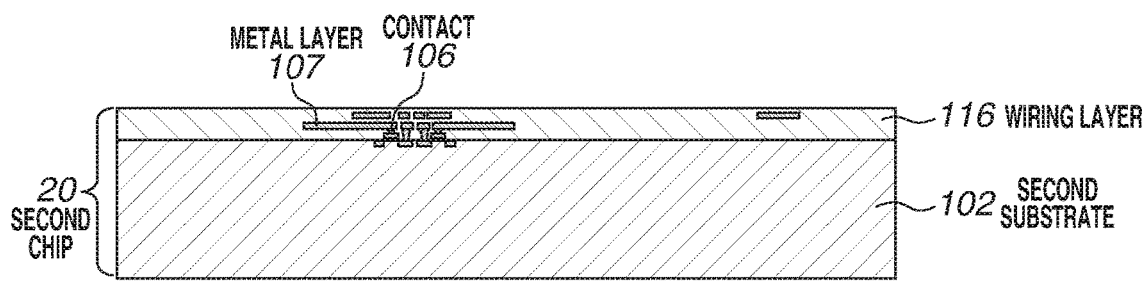

Subsequently, the second chip 20 is prepared as illustrated in FIG. 3B. A metal oxide semiconductor (MOS) transistor is formed on a surface of the second substrate 102 of the second chip 20. The wiring layer 116 is then formed on the surface of the second substrate 102 on which the MOS transistor is formed.

Figure 3C:
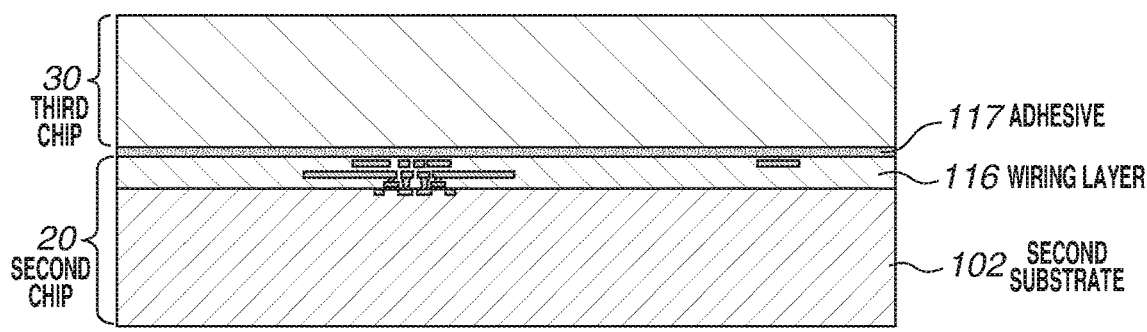

Subsequently, the wiring layer 116 formed on the surface of the second chip 20, and the third chip 30 are bonded together, as illustrated in FIG. 3C. The bonding can be performed by bonding methods such as bonding using an ultraviolet curing resin which is cured by ultraviolet irradiation, bonding by plasma activation of an oxide film, and diffusion bonding via a thin metal layer. In any of these bonding methods, the bonding is preferably performed at normal temperatures without heating each semiconductor substrate itself, in consideration of a difference in linear expansion coefficient. In a case where the material that is not warped by heating is used for the third chip 30, the bonding may be performed by heating the substrates to such an extent that the warpage of the third chip 30 and the second substrate 102 does not arise.

Figure 3D:
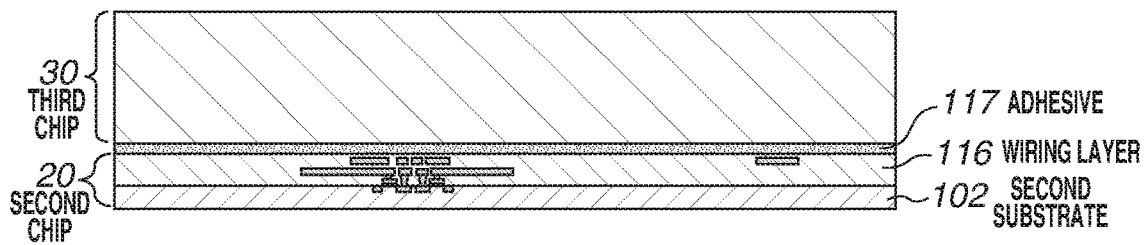

Subsequently, as illustrated in FIG. 3D, in a state where the second chip 20 and the third chip 30 are bonded together, a surface of the second chip 20 on the opposite side of the surface thereof on which the wiring layer 116 is formed is ground to thin the second chip 20. The grinding is performed, for example, by a back-grinding apparatus. The second chip 20 is thinned down to have a thickness of 10 μm after the grinding. Next, grinding scratches on the substrates made by the back-grinding apparatus are removed by a CMP apparatus. Configuring the second chip 20 using materials having different selection ratios can increase in-plane uniformity of the substrate thickness of the second chip 20. For example, assume a case of using a silicon on insulator (SOI) substrate, as the second chip 20, in which a silicon oxide film is interposed between a silicon substrate and another silicon substrate. In this case, a selection ratio of silicon to the silicon oxide film in the dry etching process of silicon is high, i.e., about 100, so that the silicon oxide film can be made to serve as an etching stop layer. Alternatively, there is a method of using silicon substrates having significantly different impurity concentrations. By using a mixed solution of hydrofluoric acid, nitric acid, and acetic acid as a chemical solution, an etching rate of which is different between p-type silicon and n-type silicon, a substrate thickness can be achieved which provides high in-plane uniformity.

Figure 3E:
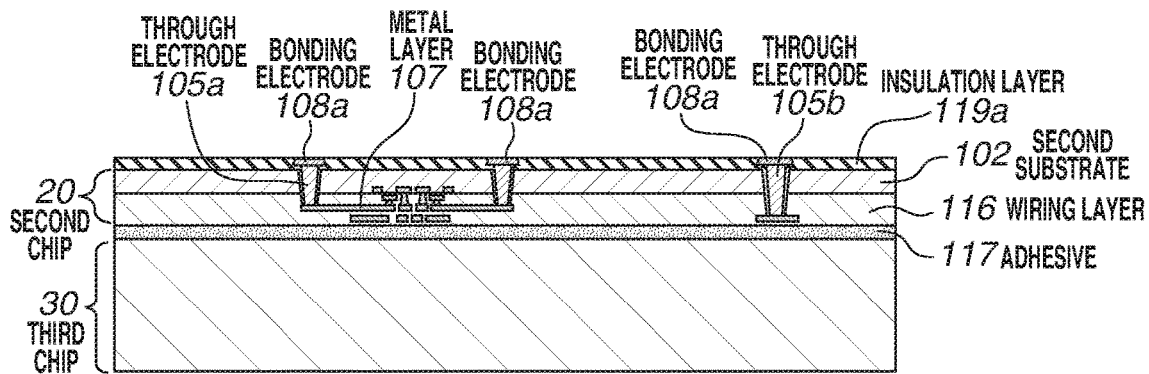

Subsequently, as illustrated in FIG. 3E, an insulation layer 119a is formed on the surface of the second chip 20 that has been ground to be thin. FIG. 3D and FIG. 3E are reversed to each other. The through electrodes 105a and 105b are formed from a surface of the insulation layer 119a on the opposite side of the second chip 20. The through electrodes 105a and 105b penetrate through the insulation layer 119a and the second chip 20 to reach the metal layer 107 included in the wiring layer 116. While the through electrodes 105a and 105b having different heights are formed in FIG. 3E, the configuration is not a prerequisite. The through electrodes 105a and 105b having the same height may be formed. The respective bonding electrodes 108a are formed on the through electrodes 105a and 105b. The insulation layer 119a is formed around the bonding electrode 108a. The insulation layer 119a is formed, for example, by a plasma chemical vapor deposition (CVD) method. The through electrodes 105a and 105b can be manufactured by a typical semiconductor process.

Figure 3F:
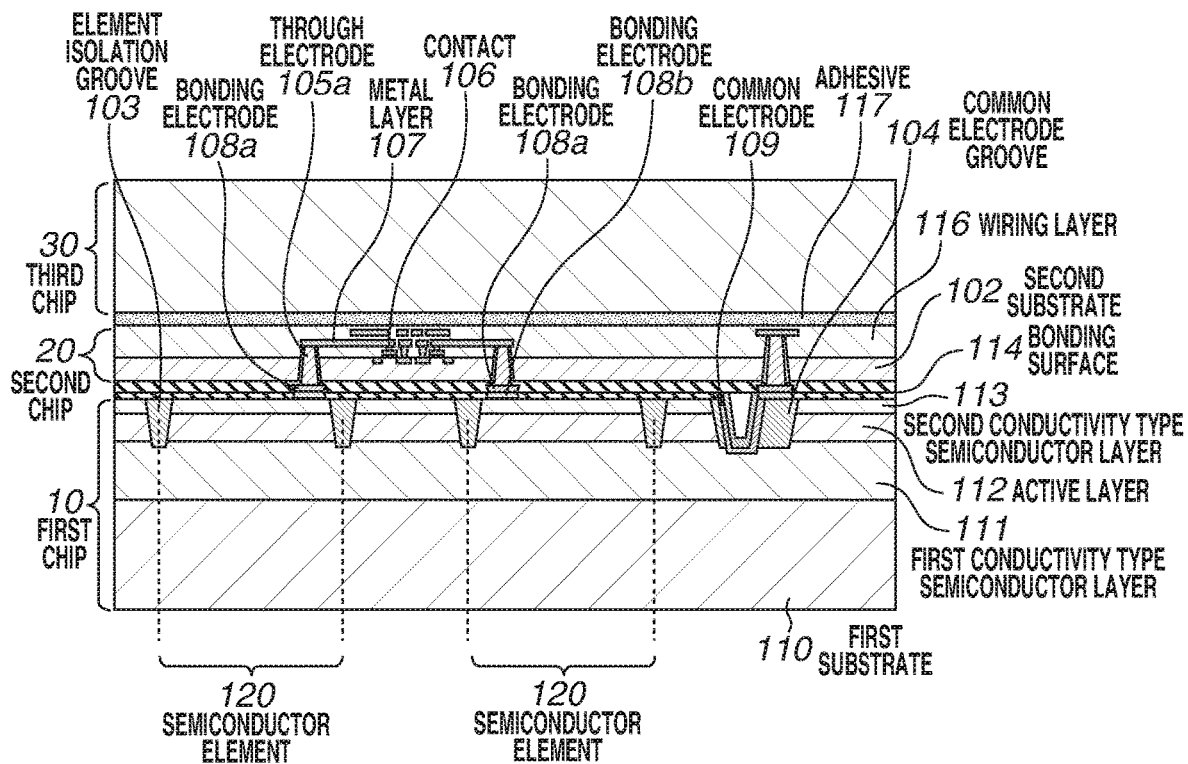

Subsequently, the first chip 10, the second chip 20, and the third chip 30 are stacked in sequence as illustrated in FIG. 3F. Thus, an intermediate member before the bonding is produced, in which the first chip 10, the second chip 20, and the third chip 30 are stacked in sequence. The first chip 10 and the second chip 20 are bonded together such that the bonding electrode 108a of the first chip 10 and the bonding electrode 108b of the second chip 20 are electrically connected to each other. A heat-bonding method is used to enhance bonding strength.

Although not illustrated, a through electrode, a pad, and the like, which are necessary for the mounting, may be formed from the first substrate 110 side of the first chip 10 or the third chip 30 side after the process illustrated in FIG. 3F.

As described above, in the present exemplary embodiment, the first substrate 110 and the third chip 30 having the substantially equal linear expansion coefficient are bonded together by subjecting to heat with the second substrate 102 interposed therebetween that has the different linear expansion coefficient. Accordingly, the second substrate 102 can be stretched following the first substrate 110 and the third chip 30, thereby misalignment can be reduced and a device having pixels arrayed at a narrow pitch can be provided. The configuration can also reduce the warpage and deformation of the substrates occurring at the time of heat-bonding or heat-mounting, and can provide a highly reliable device because the peeling due to the warpage of the substrates and the mounting defect do not occur.

A second exemplary embodiment of the present disclosure will be described with reference to FIG. 4. The present exemplary embodiment is different from the first exemplary embodiment in that the third chip 30 and an adhesive 117 are removed after the semiconductor apparatus described in the first exemplary embodiment is mounted on a mounting substrate (not illustrated). Matters except for points described below are similar to those of the first exemplary embodiment, so that a description thereof is omitted.

In FIG. 4, after the semiconductor apparatus is manufactured in a similar manner to the first exemplary embodiment illustrated in FIGS. 3A to 3F, the semiconductor apparatus is mounted on the mounting substrate using adhesive 117. After that, the third chip 30 and the adhesive 117 are removed. In a case where a reliability test of the semiconductor apparatus is conducted, it is preferable that the third chip 30 and the adhesive 117 be removed after the reliability test is finished. The third chip 30 and the adhesive 117 can be removed, for example, by peeling the adhesive 117 by an organic solvent.

The present exemplary embodiment also produces a similar advantageous effect to that produced by the first exemplary embodiment. Further, the present exemplary embodiment can reduce the warpage and deformation of the substrates occurring in the heating process when the mounting process is carried out on the mounting substrate and a thermal cycle in the reliability test, thereby it unlikely that the peeling occurs due to the warpage of the substrates and the mounting defect. Thus, the highly reliable semiconductor apparatus can be manufactured.

A manufacturing method according to a third exemplary embodiment of the present disclosure will be described below with reference FIGS. 5A to 5G. The present exemplary embodiment is different from the first exemplary embodiment in that the insulation layer is not embedded in the element isolation groove 103 and the common electrode groove 104. Matters except for points described below are similar to those of the first exemplary embodiment, so that a description thereof is omitted.

Figure 5A:
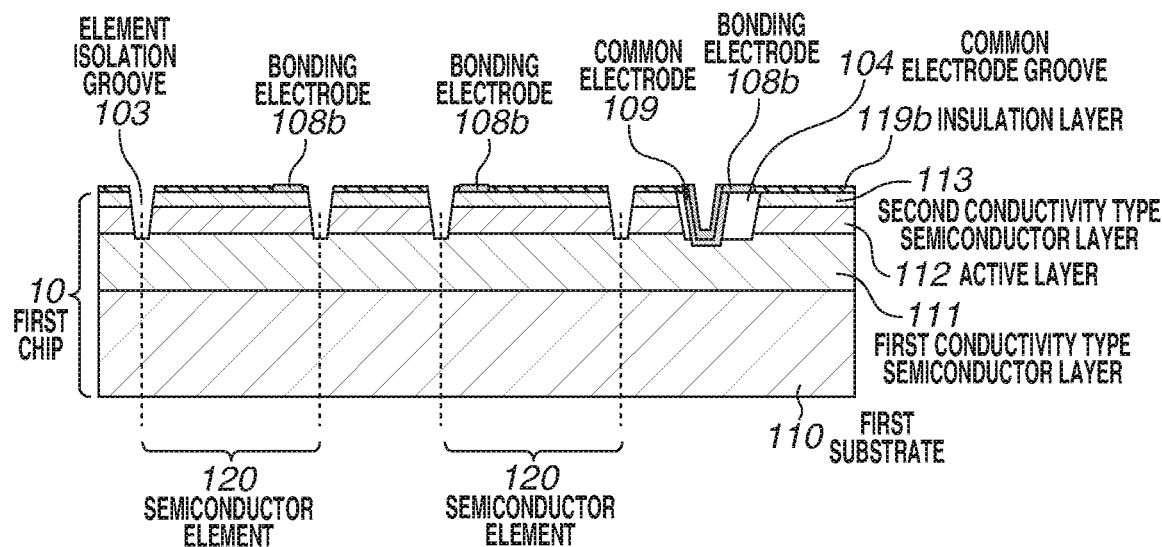

First, as illustrated in FIG. 5A, the semiconductor element 120 is formed on the first substrate 110, and then the element isolation groove 103 and the common electrode groove 104 are formed. The process so far is similar to that described with reference to FIG. 3A. After that, the process continues without embedding the insulation layer in the element isolation groove 103 and the common electrode groove 104. Accordingly, a recess portion in which an insulation material or the like is not embedded is formed around the semiconductor element 120.

Figure 5B:
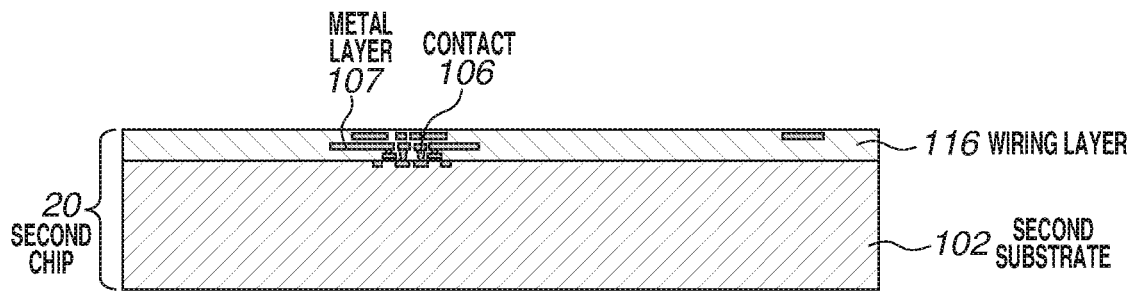
Figure 5C:
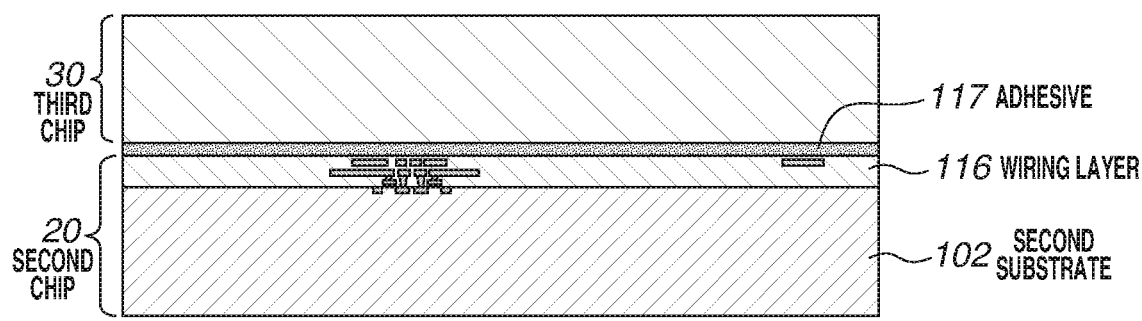
Figure 5D:
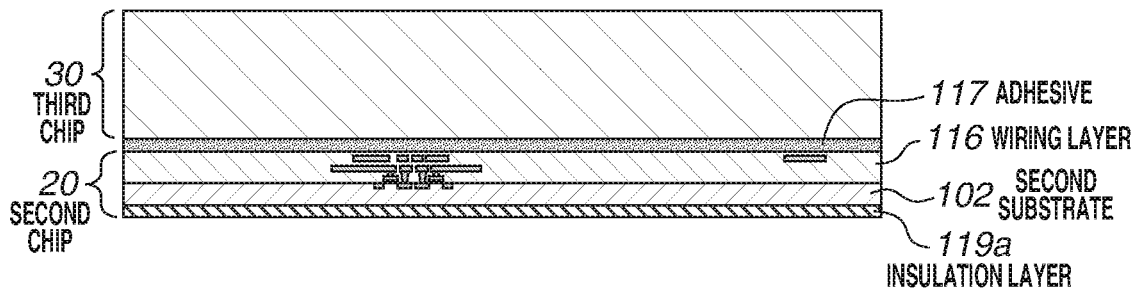

Subsequently, in FIGS. 5B to 5D, the process of forming the circuit of the second chip, the process of bonding the second chip 20 and the third chip 30 together, and the process of thinning the second chip 20 are performed in a similar manner to FIGS. 3B to 3D. After the process of thinning the second chip 20, the insulation layer 119a containing hydrogen serving as a surface protection layer is formed, as illustrated in FIG. 5D. An insulation film such as a silicon oxide film and a silicon nitride film can be used as a material for the insulation layer 119a. The insulation layer 119a can be formed, for example, by the plasma CVD method.

Figure 5E:
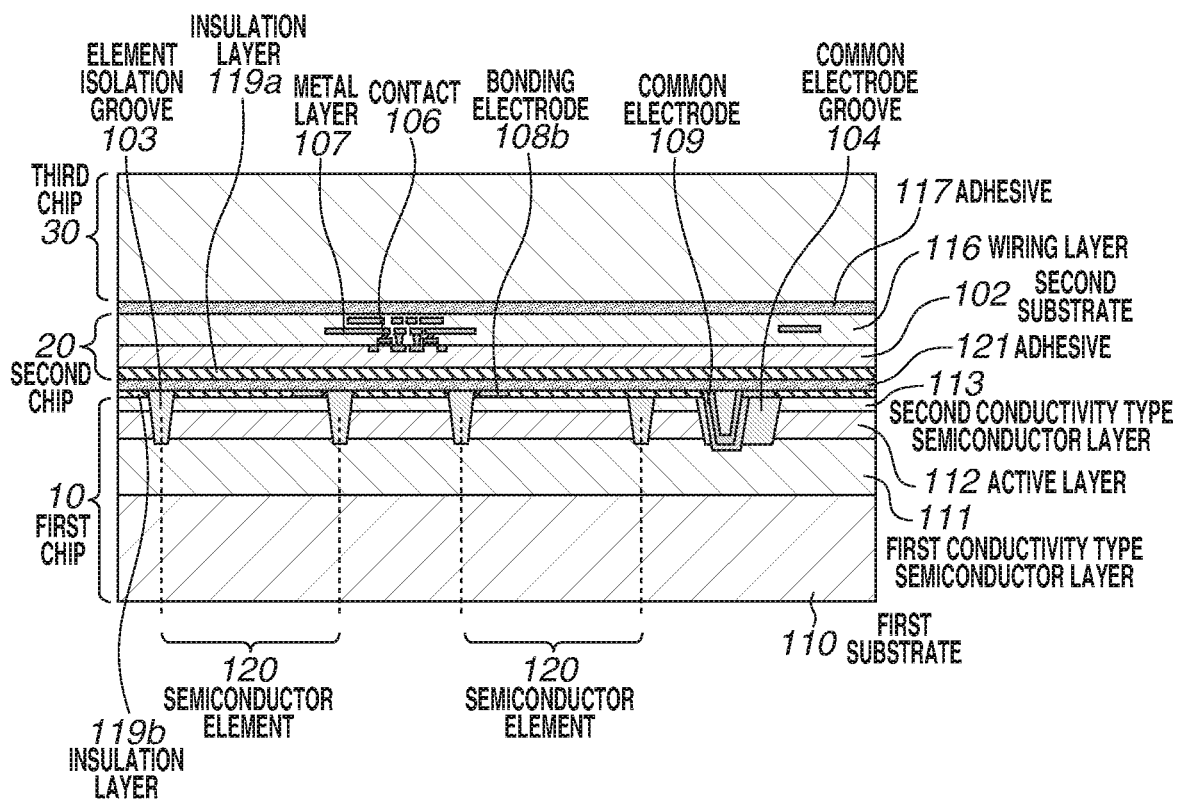

Subsequently, the insulation layer 119b formed on top of the first chip 10 and the insulation layer 119a formed on the second chip 20 are bonded together via an adhesive 121, as illustrated in FIG. 5E. The element isolation groove 103 and the common electrode groove 104 are filled with the adhesive 121. A method of bonding the substrates by subjecting to heat with a thermosetting adhesive is preferable to increase bonding strength. The present exemplary embodiment can also reduce misalignment, and thus can provide the semiconductor apparatus having pixels arrayed at a narrow pitch. Further, the present exemplary embodiment can reduce the warpage and deformation of the substrates occurring in the heating process at the time of bonding.

Subsequently, the third chip 30 and the adhesive 117 are removed as illustrated in FIG. 5F. After the third chip 30 and the adhesive 117 are removed, grooves are formed up to such a depth as to penetrate through the wiring layer 116, the second chip 20, the insulation layer 119a, and the adhesive 121 and reach the bonding electrode 108b to form the through electrodes 105a and 105b, so that through electrode 105c, that penetrates through part of the wiring layer 116 and is connected to the metal layer 107 included in the wiring layer 116, is formed. The through electrodes 105a, 105b, and 105c may be simultaneously formed. Each of the through electrodes 105a, 105b, and 105c can be manufactured by the typical semiconductor process. Furthermore, a metal layer 122, which connects the through electrodes 105a and 105c, and connects the through electrodes 105b and 105c, is formed. The metal layer 122 contains at least one of aluminum, titanium, and copper. The metal layer 122 is made by forming a metal film containing at least one of aluminum, titanium, and copper, and by letting the metal film remain at a portion where the film is desirably serves as wiring in photolithography.

Next, the wiring layer 116 formed on the second substrate 102 and the third chip 30 are bonded together with the adhesive 117, as illustrated in FIG. 5G. Instead of the adhesive bonding, the bonding can be performed by methods such bonding by plasma activation via an oxide film surface, and diffusion bonding via a thin metal layer. The bonding is preferably performed at normal temperatures, but may be performed by subjecting to heat. In FIG. 5G, the first chip 10 and the second chip 20 are bonded together, so that even if the heat-bonding is used to bond the third chip 30 and the second chip 20 together, the warpage of the second substrate 102 can be prevented. As the third chip 30, the third chip 30 that has been removed in the removal process of the third chip 30 illustrated in FIG. 5F may be used, or another new substrate may be used. In either case, as the third chip 30 to be bonded to the second chip 20, a substrate is used which has such a linear expansion coefficient that a difference in linear expansion coefficient between the substrate and the first substrate 110 is smaller than a difference in linear expansion coefficient between the first substrate 110 and the second substrate 102. That is, the substrate having the linear expansion coefficient close to that of the first substrate 110 is used as the third chip 30.

The present exemplary embodiment can also reduce the warpage and deformation of the substrates occurring at the time of heat-bonding or heat-mounting, and the peeling due to the warpage of the substrates, and the mounting defect do not occur. Thus, the highly reliable semiconductor apparatus can be provided.

The bonding process of the third chip 30 illustrated in FIG. 5G is not a prerequisite. In a case where a bonded body of the first chip 10 and the second chip 20 is mounted on the mounting substrate (not illustrated) in the bonding process of the second chip 20 and the first chip 10 illustrated in FIG. 5G, the heat-mounting does not need to be performed in a subsequent process. The processing eliminates the need for bonding the third chip 30 after forming the metal layer 122. However, it is preferable that the third chip 30 be bonded in consideration of the warpage of the substrates that can occur in the thermal cycle of the reliability test.

Figure 6:
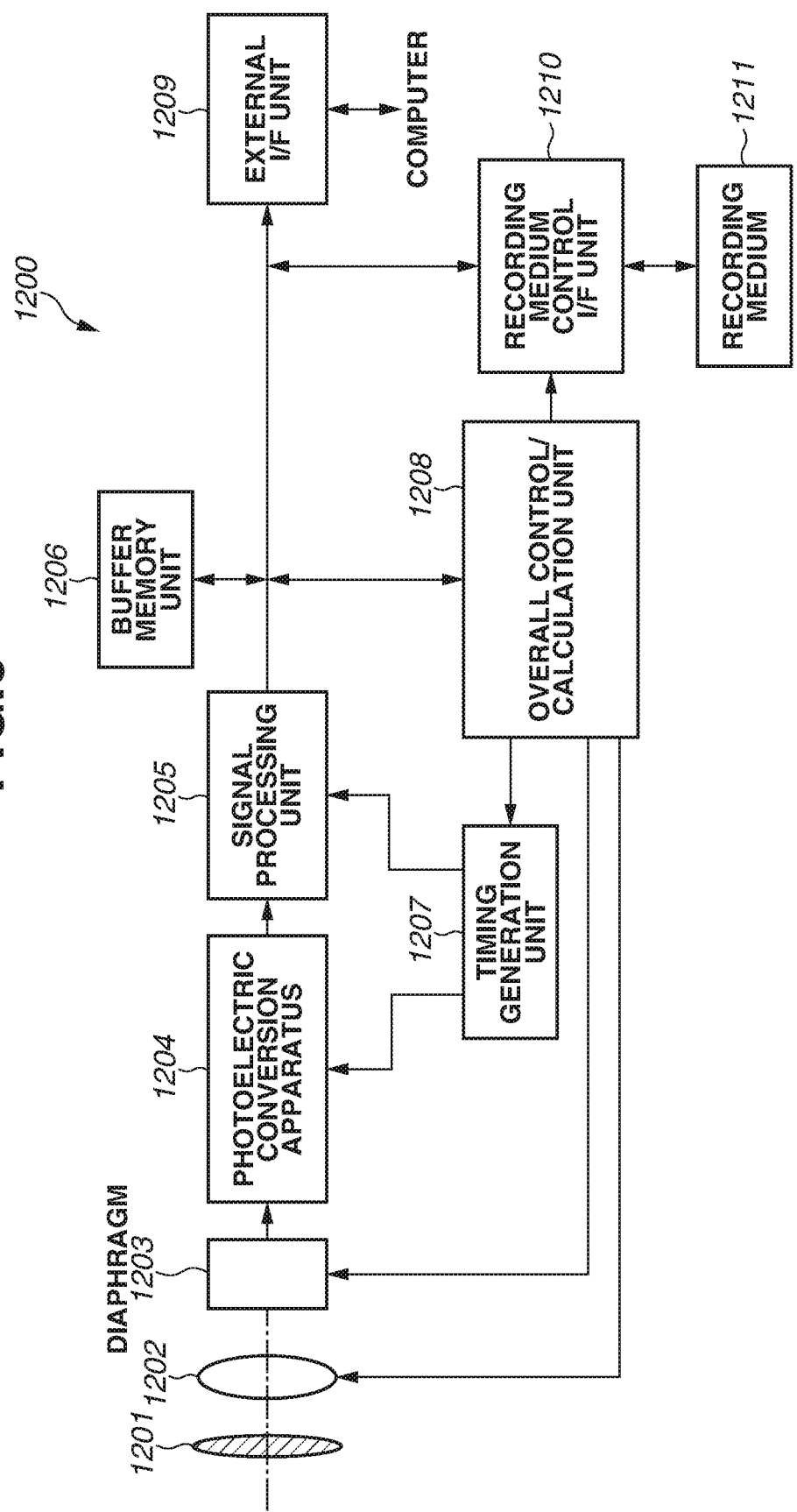
FIG. 6 is a block diagram illustrating a configuration of a photoelectric conversion system according to a fourth exemplary embodiment.

A fourth exemplary embodiment will be described below. FIG. 6 is a block diagram illustrating a configuration of a photoelectric conversion system 1200 according to the present exemplary embodiment. The photoelectric conversion system 1200 according to the present exemplary embodiment includes a photoelectric conversion apparatus 1204. Any one of the semiconductor apparatuses according to the exemplary embodiments described above can be applied to the photoelectric conversion apparatus 1204. The photoelectric conversion system 1200 can be used, for example, as an imaging system. Specific examples of the imaging system include a digital still camera, a digital camcorder, and a monitoring camera. FIG. 6 illustrates the digital still camera as an example of the photoelectric conversion system 1200.

The photoelectric conversion system 1200 illustrated in FIG. 6 includes the photoelectric conversion apparatus 1204, a lens 1202 that forms an optical image of a target object on the photoelectric conversion apparatus 1204, a diaphragm 1203 to vary an amount of light passing through the lens 1202, and a barrier 1201 to protect the lens 1202. The lens 1202 and the diaphragm 1203 constitute an optical system that collects light in the photoelectric conversion apparatus 1204.

The photoelectric conversion system 1200 further includes a signal processing unit 1205 that performs processing on output signals from the photoelectric conversion apparatus 1204. The signal processing unit 1205 performs signal processing to execute various types of correction and compression of input signals as necessary and output the signals. The photoelectric conversion system 1200 further includes a buffer memory unit 1206 to temporally store image data, and an external interface (I/F) unit 1209 to communicate with an external computer or the like. The photoelectric conversion system 1200 further includes a recording medium 1211, such as a semiconductor memory, and a recording medium control I/F unit 1210. The recording medium 1211 records or reads out captured image data. The recording medium control I/F unit 1210 controls the recording in recording medium 1211 or the readout from the recording medium 1211. The recording medium 1211 may be integrated in the photoelectric conversion system 1200 or may be detachably mounted. Further, communication from the recording medium control I/F unit 1210 to the recording medium 1211 and communication from the external I/F unit 1209 may be performed wirelessly.

The photoelectric conversion system 1200 further includes an overall control/calculation unit 1208 and a timing generation unit 1207. The overall control/calculation unit 1208 performs various calculations and controls the whole of the digital still camera. The timing generation unit 1207 outputs various timing signals to the photoelectric conversion apparatus 1204 and the signal processing unit 1205. The timing signals or the like may be input from the outside, and the photoelectric conversion system 1200 only needs to include at least the photoelectric conversion apparatus 1204, and the signal processing unit 1205 that performs processing on output signals from the photoelectric conversion apparatus 1204. As described in the fourth exemplary embodiment, the timing generation unit 1207 may be mounted on the photoelectric conversion apparatus 1204. The overall control/calculation unit 1208 and the timing generation unit 1207 may be configured to perform part or all of control functions of the photoelectric conversion apparatus 1204.

The photoelectric conversion apparatus 1204 outputs image signals to the signal processing unit 1205. The signal processing unit 1205 performs predetermined signal processing on the image signals output from the photoelectric conversion apparatus 1204, and outputs image data. The signal processing unit 1205 generates an image using the image signals. Further, the signal processing unit 1205 may perform distance measuring calculation on signals output from the photoelectric conversion apparatus 1204. The signal processing unit 1205 and the timing generation unit 1207 may be mounted on the photoelectric conversion apparatus 1204. More specifically, the signal processing unit 1205 and the timing generation unit 1207 may be arranged in a substrate on which the pixels are arrayed, or may be arranged in another substrate as described in a third exemplary embodiment. By configuring the imaging system using any one of the semiconductor apparatuses according to the exemplary embodiments described above, the imaging system capable of acquiring a higher quality image can be achieved.

Figure 7A:
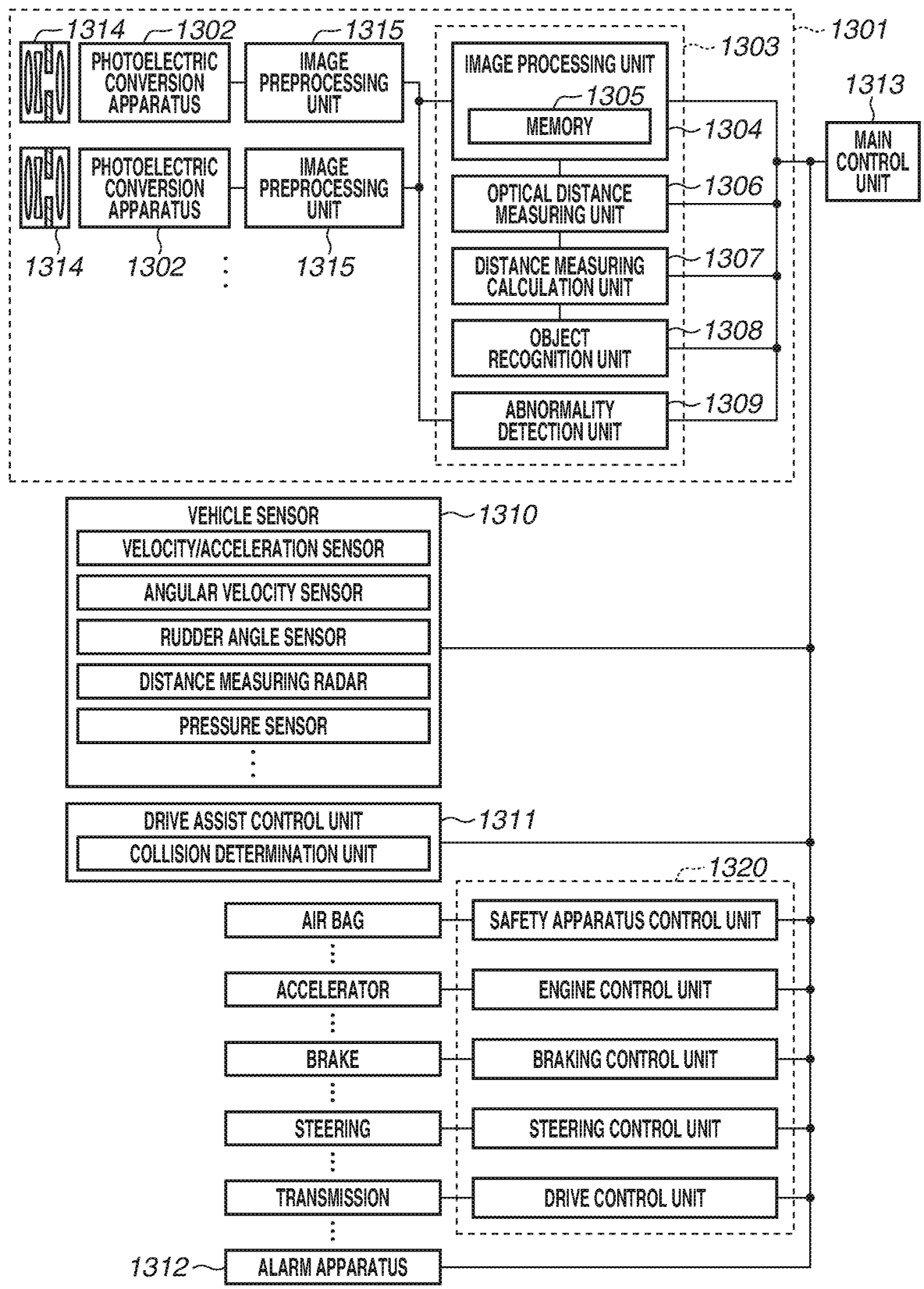

A fifth exemplary embodiment will be described below. A photoelectric conversion system and a mobile object according to the present exemplary embodiment will be described below with reference to FIGS. 7A and 7B, and FIG. 8. FIG. 7 is a schematic view illustrating a configuration example of the photoelectric conversion system and the mobile object according to the present exemplary embodiment. FIG. 8 is a flowchart illustrating operations of the photoelectric conversion system according to the present exemplary embodiment. In the present exemplary embodiment, an on-vehicle camera exemplifies the photoelectric conversion system.

FIGS. 7A and 7B illustrate an example of a vehicle system and the photoelectric conversion system that is installed on the vehicle system and that captures an image. The photoelectric conversion system 1301 includes a photoelectric conversion apparatus 1302, an image preprocessing unit 1315, an integrated circuit 1303, and an optical system 1314. The optical system 1314 forms an optical image of a target object on the photoelectric conversion apparatus 1302. The photoelectric conversion apparatus 1302 converts the optical image of the target object formed by the optical system 1314 into electric signals. The photoelectric conversion apparatus 1302 is any one of the semiconductor apparatuses according to the exemplary embodiments described above. The image preprocessing unit 1315 performs predetermined signal processing on signals output from the photoelectric conversion apparatus 1302. Functions of the image preprocessing unit 1315 may be incorporated in the photoelectric conversion apparatus 1302. The photoelectric conversion system 1301 is provided with at least two sets of the optical system 1314, the photoelectric conversion apparatus 1302, and the image preprocessing unit 1315. An output from the image preprocessing unit 1315 of each set is input into the integrated circuit 1303.

The integrated circuit 1303 is an integrated circuit for use in the imaging system, and includes an image processing unit 1304 including a memory 1305, an optical distance measuring unit 1306, a distance measuring calculation unit 1307, an object recognition unit 1308, and an abnormality detection unit 1309. The image processing unit 1304 performs image processing such as development processing and defect correction on output signals from the image preprocessing unit 1315. The memory 1305 stores primary storage data of a captured image, and a position of a defect pixel of the captured image. The optical distance measuring unit 1306 brings the target object into focus, and performs distance measuring. The distance measuring calculation unit 1307 calculates determines the measuring information by calculation from a plurality of pieces of image data acquired from the photoelectric conversion apparatuses 1302. The object recognition unit 1308 recognizes the target object such as a car, a road, a sign, and a person. The abnormality detection unit issues an alarm to a main control unit 1313 when abnormality of the photoelectric conversion apparatus 1302 is detected.

The integrated circuit 1303 may be achieved by dedicatedly designed hardware, a software module, or a combination of the hardware and the software module. The integrated circuit 1303 may be achieved by, for example, a field programmable gate array (FPGA) circuit or an application specific integrated circuit (ASIC), or a combination of these circuits.

The main control unit 1313 performs centralized control over operations of, for example, the photoelectric conversion system 1301, a vehicle sensor 1310, and a control unit 1320. As an alternative possible method, each of the photoelectric conversion system 1301, the vehicle sensor 1310, and the control unit 1320 may individually include a communication interface to transmit and receive control signals via a communication network (e.g., control area network (CAN) protocol).

The integrated circuit 1303 has a function of transmitting control signals and setting values to the photoelectric conversion apparatus 1302 in response to control signals from the main control unit 1313 or by its own control unit.

The photoelectric conversion system 1301 is connected to the vehicle sensor 1310, and can acquire travelling conditions of the vehicle such as a vehicle speed, a yaw rate, and a rudder angle, an environment outside the vehicle, and states of other vehicles and obstacles. The vehicle sensor 1310 also serves as a distance information acquisition means for acquiring distance to the target object. The photoelectric conversion system 1301 is connected to a drive assist control unit 1311 that performs a variety of drive assistance such as an autopilot function, an auto-cruise function, and a collision avoidance function. Especially with respect to a collision determination function, collision with another vehicle or an obstacle is estimated and determined based on detection results of the photoelectric conversion system 1301 and the vehicle sensor 1310. With the configuration, avoidance control is performed in a case where collision is estimated, and a safety apparatus is activated at the time of collision.

The photoelectric conversion system 1301 is also connected to an alarm apparatus 1312 that issues an alarm to a driver based on the result of the determination by the collision determination unit. For example, in a case where the result of the determination by the collision determination unit indicates a high possibility of collision, the main control unit 1313 performs control of the vehicle to avoid the collision and prevent the occurrence of damage, for example, by putting on brakes, returning an accelerator, and reducing engine output. The alarm apparatus 1312 issues an alarm to a user by giving an audible alarm or the like, displaying alarm information on a screen of a display unit such as a car navigation system and an indicator panel, and causing a seatbelt or a steering wheel to vibrate.

In the present exemplary embodiment, the photoelectric conversion system 1301 captures images around the vehicle, for example, ahead of or behind the vehicle. FIG. 7B illustrates an arrangement example of the photoelectric conversion system 1301 in a case of capturing an image ahead of the vehicle with the photoelectric conversion system 1301.

Two photoelectric conversion apparatuses 1302 are arranged ahead of a vehicle 1300. Specifically, it is preferable that the two photoelectric conversion apparatuses 1302 be arranged to be line-symmetric about a center line serving as a symmetrical axis, with respect to a forward/backward direction of the vehicle 1300 or with respect to the outer shape (e.g., width of vehicle), in the case of acquiring the distance information between the vehicle 1300 and the target object or determining the possibility of collision. It is also preferable that the photoelectric conversion apparatuses 1302 be arranged not to interfere with the visual field of the driver when the driver visually recognizes a state outside the vehicle 1300 from a driver's seat. It is preferable that the alarm apparatus 1312 be arranged at such a position as to easily come within the driver's visual field.

Next, an error detection operation of the photoelectric conversion apparatus 1302 in the photoelectric conversion system 1301 will be described with reference to FIG. 8. The error detection operation of the photoelectric conversion apparatus 1302 is performed following steps S1410 to S1480 illustrated in FIG. 8.

In step S1410, settings of the photoelectric conversion apparatus 1302 are made at the time of start-up. More particularly, the settings for operations of the photoelectric conversion system 1301 are transmitted from the outside of the photoelectric conversion system 1301 (e.g., main control unit 1313) or the inside of the photoelectric conversion system 1301, and imaging operation and error detection operation of the photoelectric conversion apparatus 1302 are started.

Subsequently, in step S1420, the photoelectric conversion apparatus 1302 acquires a pixel signal from an effective pixel. In step S1430, the photoelectric conversion apparatus 1302 also acquires an output value of an error detection pixel arranged to detect an error. The error detection pixel includes a photoelectric conversion unit in the same manner as the effective pixel. A predetermined voltage is input into the photoelectric conversion unit. The error detection pixel outputs a signal corresponding to the voltage input into the photoelectric conversion unit. The processing in step S1420 and the processing in step S1430 may be performed in reverse order.

Subsequently in step S1440, the photoelectric conversion apparatus 1302 determines whether an expected output value of the error detection pixel and an actual output value of the error detection pixel match each other. In a case where the expected output value and the actual output value match each other as a result of the determination in step S1440 (YES in step S1440), the processing proceeds to step S1450. In step S1450, the photoelectric conversion apparatus 1302 determines that an imaging operation is normally performed, and the processing proceeds to step S1460. In step S1460, the photoelectric conversion apparatus 1302 transmits pixel signals of a scanned row to the memory 1305, and stores data as primary storage data. After that, the processing returns back to step S1420, and the error detection operation continues. On the other hand, in a case where the expected output value and the actual output value do not match each other as a result of the determination in step S1440 (NO in step S1440), the processing proceeds to step S1470. In step S1470, the photoelectric conversion apparatus 1302 determines that the imaging operation is abnormal, and issues an alarm to the main control unit 1313 or the alarm apparatus 1312. The alarm apparatus 1312 causes the display unit to display the abnormality that has been detected. After that, in step S1480, the photoelectric conversion apparatus 1302 is stopped and the operation in the photoelectric conversion system 1301 ends.

While the present exemplary embodiment has been described by the example in which the error detection operation is performed by executing a loop of the flowchart for each row, the error detection operation may be performed by executing the loop for a plurality of rows or for each frame. The issuance of the alarm in step S1470 may be made to the outside of the vehicle via a wireless network.

While the control to prevent collision with another vehicle has been described in the present exemplary embodiment, the present exemplary embodiment can be applied to control in automated driving when following another vehicle, and control in automated driving to prevent lane departure. Further, the photoelectric conversion system 1301 is not limited to a vehicle such as an automobile, and can be applied to a mobile object (mobile apparatus) such as a ship, an aircraft, and an industrial robot. In addition, the photoelectric conversion system 1301 is not limited to the mobile object, and can be applied to a wide range of apparatuses using object recognition such as an intelligent transportation system (ITS).

A sixth exemplary embodiment will be described below. A display apparatus according to the present exemplary embodiment will be described below with reference to FIGS. 9A and 9B. The display apparatus includes any one of the semiconductor apparatuses according to the first to third exemplary embodiments. A semiconductor element included in the semiconductor apparatus according to the present exemplary embodiment is a light emitting element. Other than the display apparatus and the lighting apparatus, the semiconductor apparatus can be used in an exposing source of an electrophotographic image forming apparatus, a backlight of a liquid crystal display apparatus, and a light emitting apparatus with a white light source including a color filter.

The display apparatus may be an image information processing apparatus that includes an image input unit into which image information from an area charge-coupled device (CCD), a linear CCD, a memory card, or the like is input, and an information processing unit that processes the input information to cause a display unit to display an input image.

A display unit included in the imaging apparatus or an ink jet printer may have a touch panel function. A driving method of the touch panel function may be an infrared method, an electrostatic capacitance method, a resistance film method, and an electromagnetic induction method, and is not specifically limited. The display apparatus may be used as a display unit of a multifunction printer.

The display apparatus according to the present exemplary embodiment may be used as a display unit of a mobile terminal. In this case, the display unit may have both a display function and an operation function. Examples of the mobile terminal include a mobile phone such as a smartphone, a tablet, and a head-mounted display.

The display apparatus according to the present exemplary embodiment may be used for the display unit of the imaging apparatus that includes an optical unit with a plurality of lenses, and an imaging element that receives light that has passed through the optical unit. The imaging apparatus may include the display unit that displays information acquired by the imaging element. Alternatively, the display unit may be a unit being exposed to the outside of the imaging apparatus, or a unit arranged within a viewfinder. The imaging apparatus may be a digital camera or a digital video camera.

Figure 9A:
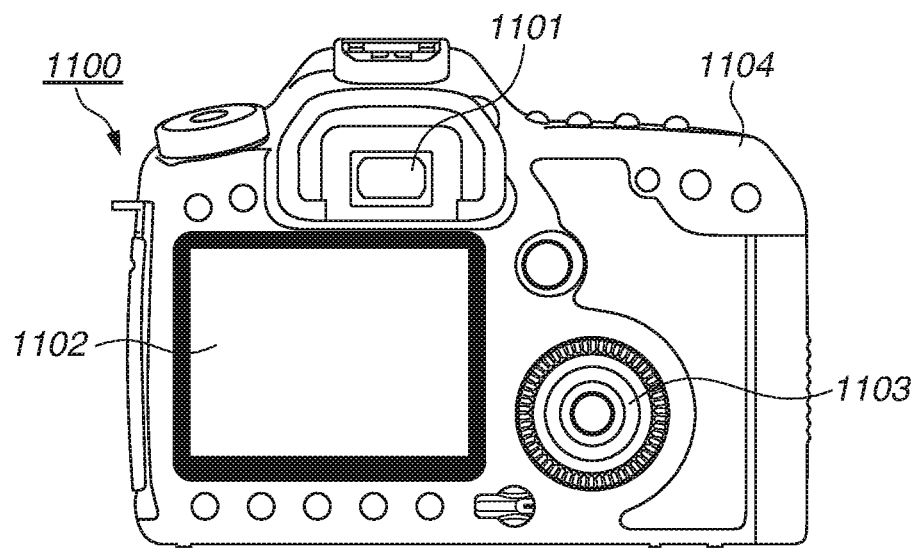
FIGS. 9A to 9B are schematic views illustrating a lighting apparatus according to a sixth exemplary embodiment.

FIG. 9A is a schematic diagram illustrating an example of the imaging apparatus according to the present exemplary embodiment. An imaging apparatus 1100 may include a viewfinder 1101, a back display 1102, an operation unit 1103, and a housing 1104. The viewfinder 1101 may include the display apparatus according to the present exemplary embodiment. In that case, the display apparatus may display not only a captured image, but also environment information, instructions for imaging, and the like. The environment information may be, for example, intensity of outside light, a direction of outside light, a moving speed of a target object, and a possibility that the target object is shielded by a shielding object.

Figure 9B:
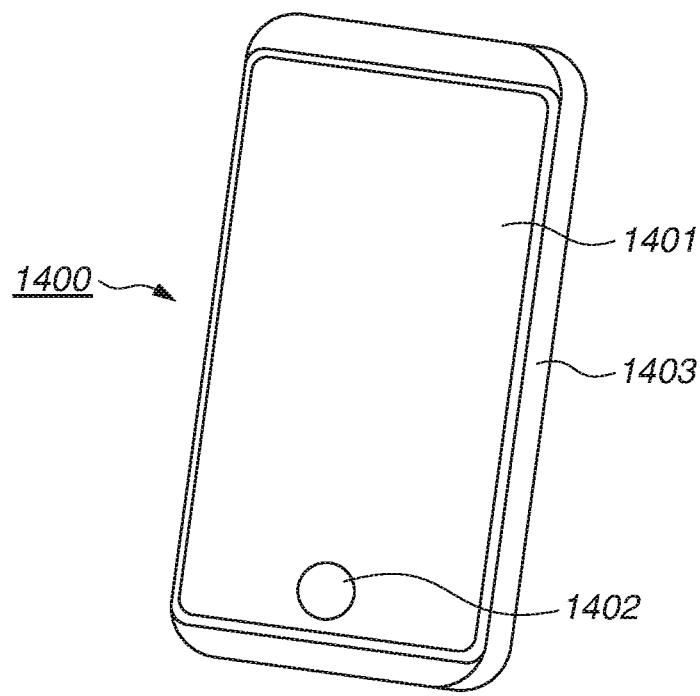

FIG. 9B is a schematic diagram illustrating an example of an electronic apparatus according to the present exemplary embodiment. An electronic apparatus 1400 includes a display unit 1401, an operation unit 1402, and a housing 1403. The housing 1403 may include a circuit, a printed substrate having the circuit, a battery, and a communication unit. The operation unit 1402 may be buttons, or a touch-panel response unit. The operation unit may be a biometric recognition unit that recognizes a fingerprint to unlock a key. The electronic apparatus including the communication unit can also serve as a communication apparatus. The electronic apparatus may further have a camera function by including a lens and an imaging element. An image captured by the camera function is displayed on the display unit. Examples of the electronic apparatus include a smartphone and a notebook computer.

In a case where the semiconductor element is a light emitting element in a near-infrared region, the semiconductor element may emit near-infrared light as illumination light from the imaging apparatus. For example, the imaging apparatus can be used for a food inspection and an inspection for a degradation level of concrete.

The semiconductor apparatus according to the present disclosure may be configured to further include a color filter and a micro lens or to acquire a variety of information such as distance information. While the amplification transistor is part of the source follower circuit, the amplification transistor may constitute part of an analog-digital (AD) converter. Specifically, the amplification transistor may constitute part of a comparator included in the AD converter. A configuration may also be employed in which part of constituent elements in the comparator may be arranged in another semiconductor substrate.

The present disclosure is not limited to the exemplary embodiments described above, and various modifications thereof can be made. For example, the present disclosure can employ an example in which part of the constituent elements of any one of the exemplary embodiments is added to another one of the exemplary embodiments or is replaced with part of the constituent elements of another exemplary embodiment.

The exemplary embodiments described above are merely specific examples of implementing the present disclosure, and the scope of the present disclosure should not be interpreted in a limited manner. In other words, the present disclosure can be implemented in various modes without departing from the technical idea or the principal features of the present disclosure.

The present disclosure can reduce the occurrence of the warpage of the substrates, and also prevent misalignment at the time of bonding even if the substrates composed of materials different in linear expansion coefficient are bonded together by heating.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-157290, filed Aug. 29, 2019, which is hereby incorporated by reference herein in its entirety.

What is claimed is:

1. A manufacturing method of a semiconductor apparatus, comprising:
    preparing an intermediate member that includes:
        a first member including a first substrate a comprising a semiconductor element formed thereon;
        a second member including a second substrate, the second substrate including a part of a circuit electrically connected to the semiconductor element and having a linear expansion coefficient different from a linear expansion coefficient of the first substrate; and a third member including a third substrate, wherein a difference between a linear expansion coefficient of the third substrate and the linear expansion coefficient of the first substrate is smaller than a difference between the linear expansion coefficient of the first substrate and the linear expansion coefficient of the second substrate, and wherein the second member is interposed between the first member and the third member; and heating the intermediate member to bond the first member and the second member together, so as to form a bonding including a first bonding electrode containing copper and electrically connected to the semiconductor element and a second bonding electrode containing copper and electrically connected to the circuit.

2. A manufacturing method of a semiconductor apparatus, the method comprising:

preparing an intermediate member that includes:
  a first member including a first substrate composed of a compound semiconductor and comprising a semiconductor element formed thereon;
  a second member including a second substrate composed of silicon and including a part of a circuit electrically connected to the semiconductor element; and
  a third member including a third substrate having a linear expansion coefficient in a range from $3\times10^{-6}$/K to $6.5\times10^{-6}$/K inclusive, wherein the second member is interposed between the first member and the third member; and
heating the intermediate member to bond the first member and the second member together.

3. The manufacturing method of the semiconductor apparatus according to claim 1, wherein preparing the intermediate member includes bonding the second member and the third member at normal temperatures.

4. The manufacturing method of the semiconductor apparatus according to claim 3, wherein bonding at normal temperatures is performed using an ultraviolet-curing adhesive.

5. The manufacturing method of the semiconductor apparatus according to claim 4, wherein the ultraviolet-curing adhesive is light transmissive.

6. The manufacturing method of the semiconductor apparatus according to claim 1, further comprising thinning a surface of the second substrate bonded to the third member before heating the intermediate member, the surface being on an opposite side of a surface on which the third member is mounted.

7. The manufacturing method of the semiconductor apparatus according to claim 6, wherein a thickness of the second substrate after the thinning is smaller than a thickness of the first substrate.

8. The manufacturing method of the semiconductor apparatus according to claim 6, further comprising forming a through electrode in the second electrode after thinning of the surface of the second substrate on the opposite side of the surface on which the third member is mounted.

9. The manufacturing method of the semiconductor apparatus according to claim 1, wherein the semiconductor element is at least one of a light receiving element and a light emitting element.

10. The manufacturing method of the semiconductor apparatus according to claim 9, wherein the circuit is at least one of a readout circuit configured to read out a signal of the semiconductor element and a control circuit configured to control a potential to the semiconductor element.

11. The manufacturing method of the semiconductor apparatus according to claim 1, further comprising removing the third member after the bonding.

12. The manufacturing method of the semiconductor apparatus according to claim 1, wherein the first substrate contains a group III-V semiconductor.

13. The manufacturing method of the semiconductor apparatus according to claim 10,
  wherein the first member includes a first insulation film on a side proximal the second member,
  wherein the second member includes a second insulation film on a side proximal the second member, and
  wherein in the bonding of the first member and the second member, the first insulation film and the second insulation film are bonded together.

14. A semiconductor apparatus comprising:
  a first member including a first substrate composed of a compound semiconductor and comprising a semiconductor element formed thereon;
  a second member bonded to the first member and including a second substrate, the second substrate including a part of a circuit electrically connected to the semiconductor element and being composed of silicon; and
  a third member bonded to the second member, and including a third substrate having a linear expansion coefficient in a range from $3\times10^{-6}$/K to $6.5\times10^{-6}$/K inclusive, the first member, the second member, and the third member being stacked in sequence.

15. The semiconductor apparatus according to claim 14, wherein the third member is light transmissive.

16. The semiconductor apparatus according to claim 15, wherein a light transmissive adhesive is arranged between the third member and the second substrate.

17. The semiconductor apparatus according to claim 16, wherein a thickness of the second substrate is smaller than a thickness of the first substrate.

18. A semiconductor apparatus comprising:
  a first member including a first substrate composed of a compound semiconductor and comprising a semiconductor element formed thereon;
  a second member bonded to the first member, the second member including a second substrate composed of silicon and comprising a part of a circuit electrically connected to the semiconductor element, wherein the first member and the second member are stacked with each other;
  a first bonding electrode and a first insulation film formed on a side proximal to the second member; and
  a second bonding electrode and a second insulation film formed on a side proximal to first member side,
  wherein the first bonding electrode and the second bonding electrode are bonded together, and the first insulation film and the second insulation film are bonded together.

19. The semiconductor apparatus according to claim 18, wherein the semiconductor element is at least one of a light receiving element and a light emitting element.

20. The semiconductor apparatus according to claim 19, wherein the semiconductor element contains a group III-V semiconductor.

21. The semiconductor apparatus according to claim 20, wherein the first bonding electrode and the second bonding electrode are composed of copper.

* * * * *